(12) United States Patent
Wu et al.

(10) Patent No.: US 9,715,321 B2
(45) Date of Patent: Jul. 25, 2017

(54) CAPACITANCE SENSOR WITH NOISE REJECTION

(71) Applicant: FREESCALE SEMICONDUCTOR, INC., Austin, TX (US)

(72) Inventors: Xiaolei Wu, Tianjin (CN); Liang Qiu, Tianjin (CN)

(73) Assignee: NXP USA, INC., Austin, TX (US)

( * ) Notice: Subject to any disclaimer, the term of this patent is extended or adjusted under 35 U.S.C. 154(b) by 147 days.

(21) Appl. No.: 14/946,750

(22) Filed: Nov. 19, 2015

(65) Prior Publication Data
US 2016/0357284 A1 Dec. 8, 2016

(30) Foreign Application Priority Data

Jun. 5, 2015 (CN) .......................... 2015 1 0426423

(51) Int. Cl.
G06F 3/045 (2006.01)
G06F 3/044 (2006.01)
G06F 3/041 (2006.01)
H03K 17/96 (2006.01)

(52) U.S. Cl.
CPC ............ G06F 3/044 (2013.01); G06F 3/0418 (2013.01); H03K 17/962 (2013.01); *H03K 2217/96074* (2013.01); *H03K 2217/960705* (2013.01); *H03K 2217/960725* (2013.01)

(58) Field of Classification Search
CPC ..... G06F 3/044; G06F 3/0418; H03K 17/962; H03K 2217/960705; H03K 2217/960725; H03K 2217/96074
See application file for complete search history.

(56) References Cited

U.S. PATENT DOCUMENTS

| 7,129,714 | B2 | 10/2006 | Baxter |
| 8,344,928 | B2 | 1/2013 | Guedon et al. |
| 8,358,142 | B2 | 1/2013 | Maharyta |
| 8,605,037 | B2 | 12/2013 | Philipp et al. |
| 8,614,587 | B1 | 12/2013 | Ogirko et al. |
| 8,659,306 | B2 | 2/2014 | Bruwer et al. |
| 2010/0085322 | A1* | 4/2010 | Mamba ................... G06F 3/044 345/173 |
| 2010/0328262 | A1* | 12/2010 | Huang ................... G06F 3/0416 345/174 |
| 2013/0162586 | A1 | 6/2013 | Erdogan et al. |
| 2014/0145965 | A1 | 5/2014 | Liu et al. |
| 2014/0292375 | A1* | 10/2014 | Angelini ................... G06G 7/00 327/94 |

* cited by examiner

*Primary Examiner* — Adam R Giesy
(74) *Attorney, Agent, or Firm* — Charles E. Bergere

(57) ABSTRACT

A sensor for providing an output signal that is a function of a sensed capacitance, in a touch interface for example. The sensor includes a charger for repetitively applying first and second voltages to charge the sensed capacitance to first and second charge values in first and second phases respectively. A sampler provides first and second sample signals that are a function of the first and second charge values respectively. An accumulator uses an accumulator signal to provide the output signal. The accumulator repetitively uses the first sample signal incrementally and the second sample signal decrementally in providing the accumulator signal. The accumulator signal is a progressive function of the sensed capacitance but tends to cancel a noise in the first and second sample signals at frequencies less than a repetition rate of operation of the accumulator.

20 Claims, 4 Drawing Sheets

CAPACITANCE SENSOR WITH NOISE REJECTION

BACKGROUND

The present invention is directed to integrated circuits and, more particularly, to a capacitance sensor with noise rejection.

Capacitance sensors can be used to detect or measure variation of capacitance such as in a capacitive touch panel interface. Common examples of capacitive interfaces are touchpads and touchscreens. In a capacitive touch interface, proximity of an electrically conductive object, such as a human finger or conductive stylus, alters electric fields in the touch interface. The capacitance sensor can sense or measure the physical position or movement of the object relative to the interface and provide a corresponding analog or digital code output signal.

Capacitive interfaces have a matrix of capacitive elements. Sensing the variations of capacitance in the interface is subject to perturbations, referred to as noise, which may be due to conduction from a power supply or adjacent circuit elements, or induced by external radiation. The noise may be at frequencies higher or lower than the operating frequency of the capacitance sensor.

It would be advantageous to have a capacitance sensor with a high level of noise rejection, suitable especially for use in noisy environments.

BRIEF DESCRIPTION OF THE DRAWINGS

The present invention, together with objects and advantages thereof, may best be understood by reference to the following description of embodiments thereof shown in the accompanying drawings. Elements in the drawings are illustrated for simplicity and clarity and have not necessarily been drawn to scale.

DETAILED DESCRIPTION

Figure 1:
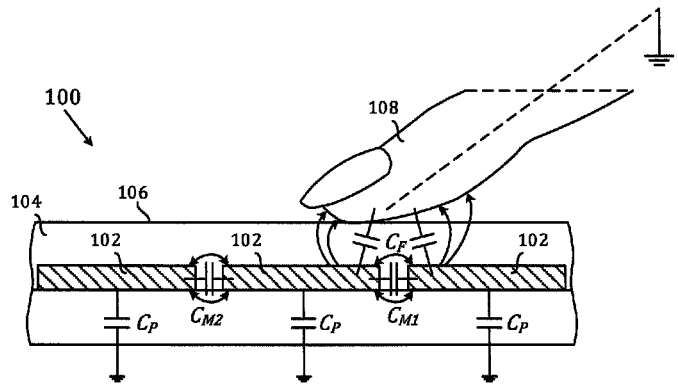
FIG. 1 is a cross-sectional view of a capacitive touch panel interface in which the present invention can be implemented.

FIG. 1 illustrates a capacitive touch panel interface 100 for which the present invention can be implemented. The touch panel interface 100 may be a touchpad controlling a separate display or a touch screen, where the display screen is integrated under the touch panel and visible through the touch panel interface 100. A capacitive touch panel typically has an array of capacitive elements such as capacitive element 102, which is embedded in an insulator material 104 beneath a surface 106 of the material 104 that the user can touch. The capacitive elements 102 may be formed in a single layer, side by side, or in two superposed layers (not shown) of row and column conductors respectively, at the intersections between the rows and columns. The capacitance detected may be a self-capacitance between the capacitive element and ground, formed by a finger or stylus. Alternatively, as illustrated in FIG. 1, the capacitance detected may be a mutual capacitance $C_M$ between a row capacitive element and a column capacitive element in the presence of parasitic capacitances $C_P$. The proximity of a finger or stylus 108 alters the electrostatic fields, illustrated by double-headed arrows, introducing an additional capacitance $C_F$ and altering the mutual capacitance $C_M$.

Figure 2:
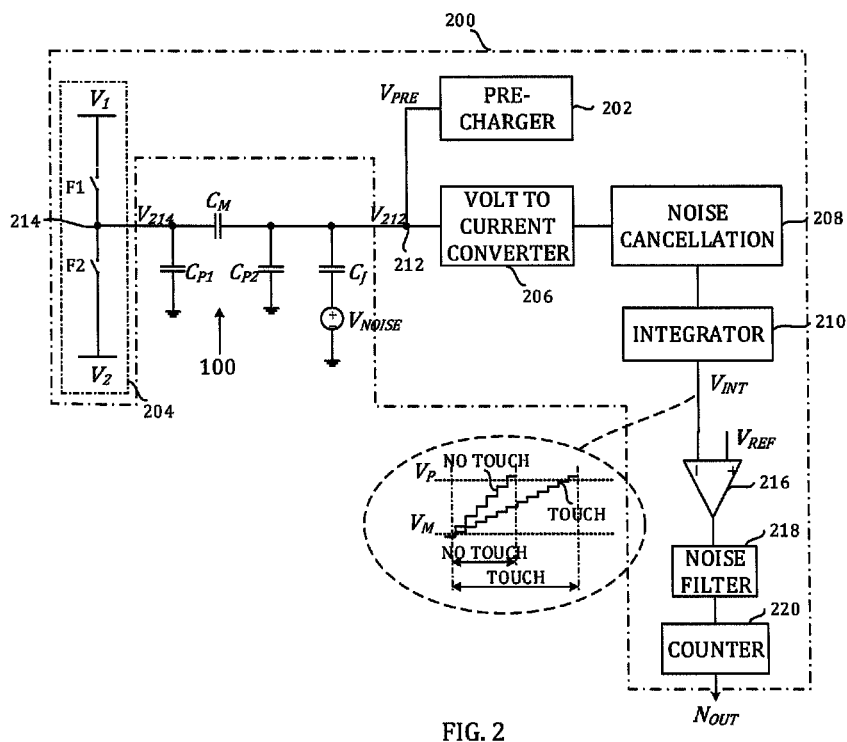
FIG. 2 is a schematic block diagram of a capacitive sensing apparatus in accordance with an embodiment of the invention.
Figure 3:
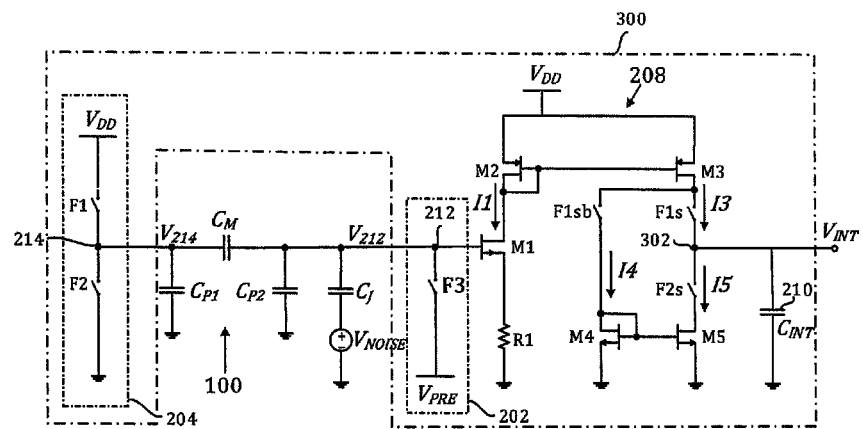
FIG. 3 is a schematic circuit diagram of the capacitive sensing apparatus of FIG. 2 in accordance with an embodiment of the invention.
Figure 5:
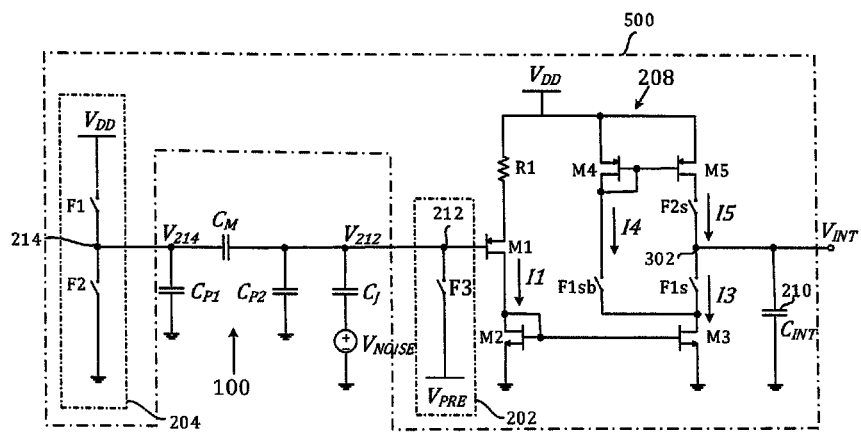
FIG. 5 is a schematic circuit diagram of another embodiment of the capacitive sensing apparatus of FIG. 2.

FIG. 2 illustrates a sensor 200 for providing an output signal $N_{OUT}$ that is a function of a sensed capacitance $C_M$ to which the sensor 200 is connected. FIGS. 3 and 5 illustrate in more detail two implementations 300 and 500 of the sensor 200. The sensor 200 is shown sensing a mutual capacitance $C_M$ in a touch interface 100, but it will be appreciated that the sensor 200 can be adapted to other technologies of touch interface, including a self-capacitance touch interface, and more widely to sensing capacitances in other types of apparatus.

The sensor 200, 300, 500 comprises a charger 202, 204 for repetitively applying first and second voltages to charge the sensed capacitance $C_M$ to first and second charge values in first and second phases φ1, φ2 respectively. A sampler 206 provides first and second sample signals I3, I5 that are a function of the first and second charge values respectively. An accumulator 208, 210 uses an accumulator signal $V_{INT}$ to provide the output signal $N_{OUT}$. The accumulator 208, 210 repetitively uses the first sample signal I3 incrementally and the second sample signal I5 decrementally in providing the accumulator signal $V_{INT}$. The accumulator signal $V_{INT}$ is a progressive function of the sensed capacitance $C_M$ but tends to cancel a noise in the first and second sample signals I3, I5 at frequencies less than a repetition rate of operation of the accumulator.

The accumulator 208, 210 may include an accumulator capacitor $C_{INT}$ whose charge value is a progressive function of the sample signals I3, I5, and the accumulator signal $V_{INT}$ is a function of the charge value on the accumulator capacitor $C_{INT}$.

The sample signals I3, I5 may be current signals. The sampler 206 may include a voltage-to-current converter M1, R1 for converting voltages $V_{212}$ at the sensed capacitance $C_M$ to current signals I1. The accumulator 208, 210 may include at least a first current mirror M2, M3 for controlling the rate at which the accumulator signal $V_{INT}$ varies. The first current mirror M2, M3 may control the rate at which the accumulator signal $V_{INT}$ varies incrementally as a function of the first sample signal I3, and may control supply of current I4 to a second current mirror M4, M5, which controls the rate at which the accumulator signal $V_{INT}$ varies decrementally as a function of the second sample signal I5.

The sensed capacitance may be a mutual capacitance $C_M$ between capacitive elements of an array in the presence of parasitic capacitances $C_P$ to other elements. The sensor 200 may include switch arrays F3 for connecting the charger through a first connection 212 to apply a pre-charge voltage $V_{PRE}$ to a selected capacitance element, and F1, F2 for connecting the charger through a second connection 214 to apply a modifying voltage $V_1$, $V_2$ to the selected capacitance element $C_M$ during at least one of the first and second phases φ1, φ2. The sampler 206 may be connected to the first connection 212 to provide the first and second sample signals I3, I5 while the charger 202, 204 is disconnected from the first connection 212. The charger 202, 204 applying the modifying voltage $V_1$, $V_2$ to the second connection 214 may charge the sensed capacitance $C_M$ during one of the first and second phases φ1, φ2 to a greater charge value than the pre-charge voltage $V_{PRE}$ does, and may charge the sensed capacitance $C_M$ during the other of the first and second phases φ2, φ1 to a lesser charge value than the pre-charge voltage $V_{PRE}$ does. Alternatively, the charger 202, 204 applying the modifying voltage $V_1$, $V_2$ to the second connection 214 may charge the sensed capacitance $C_M$ during one of the first and second phases φ1, φ2 to a greater charge value than the pre-charge voltage $V_{PRE}$ does, and may leave the sensed capacitance $C_M$ during the other of the first and second phases φ2, φ1 at the same charge value as the pre-charge voltage $V_{PRE}$ does.

In more detail, as shown in FIG. 2, the accumulator (208, 210) has a noise cancellation module 208 and an integrator module 210. The noise cancellation module 208 applies the sample signals I3 and I5 in different senses (incrementally and decrementally) to the integrator module 210 to vary the value of the accumulator signal $V_{INT}$ in steps. The accumulator signal $V_{INT}$ is input to a comparator 216 that compares it with a reference voltage $V_{REF}$. The comparator 216 outputs signals when the accumulator signal $V_{INT}$ is equal to the initial voltage and the reference voltage respectively. A counter 220 counts, through a band-pass filter 218, the number of steps N in the accumulator signal $V_{INT}$ at the clock rate (the repetition rate of the measurements) between the initial voltage and the reference voltage $V_{REF}$. The number of steps N at the clock rate (the repetition rate of the operation of the sensor 200) is a measure of the time taken, is a progressive function of the sensed capacitance $C_M$, and is different when a touch event is occurring than when no touch event is occurring. Noise in the first and second sample signals I3, I5 at frequencies below the repetition rate of the measurements is cancelled out by the noise cancellation module 208 using the first and second sample signals I3, I5 successively incrementally and decrementally in providing the accumulator signal $V_{INT}$. Noise in the first and second sample signals I3, I5 at frequencies above the repetition rate of the measurements averages out in the integrator module 210. Noise in the first and second sample signals I3, I5 at the same frequency as, or multiples of, the repetition rate of the measurements can be reduced using a conventional technique of spread spectrum clock (SSC), in which the repetition rate of the measurements varies periodically.

The sensors 200, 300 and 500 sense a mutual capacitance $C_M$ in a touch interface 100, in which the nodes 212 and 214 on both sides of the capacitance $C_M$ are accessible to apply variable voltages. The charger (202, 204) comprises a pre-charger 202 and a switch module 204. In operation, the pre-charger 202 applies the pre-charge voltage $V_{PRE}$ to the node 212 at the start of each of the first and second phases φ1, φ2. The switch module 204 has switches F1 and F2 for connecting the node 214 to power supplies $V_1$ and $V_2$. In this example, the $V_1$ is at a positive voltage $V_{DD}$ and the power supply $V_2$ is ground.

In the sensor 300, MOSFETs M1, M4 and M5 are n-type, their sources are connected to ground (through the resistor R1 in the case of M1) and their drains are connected to the positive voltage supply $V_{DD}$ through the switches F1s and F1Sb and MOSFETS M2 and M3, which are p-type. In the sensor 500, shown in FIG. 5, the MOSFETs M1, M4 and M5 are p-type, their sources are connected to the positive voltage supply $V_{DD}$ (through the resistor R1 in the case of M1) and their drains are connected to ground through the switches F1s and F1Sb and the MOSFETS M2 and M4, which are n-type. It will be appreciated that the operation of the sensor 500 otherwise is similar to the operation of the sensor 300.

Figure 4:
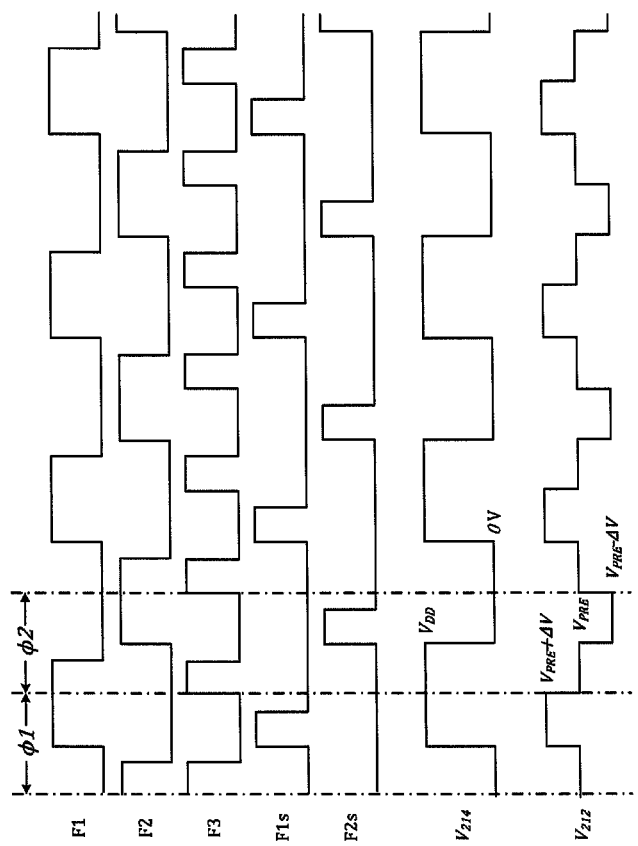
FIG. 4 is a graph against time of signals appearing in operation of the apparatus of FIG. 3.

FIG. 4 illustrates values in operation of the sensors 300 and 500. The states of the switches F1, F2 and F3 are shown as high when conductive and low when non-conductive. At the start of each first phase φ1, the switch F3 closes (conducts) so that the pre-charger 202 applies the pre-charge voltage $V_{PRE}$ to the node 212 while the switch F2 is conductive to connect the node 214 to ground during a sufficient time for the selected capacitance element $C_M$ (and the parasitic capacitor $C_{P2}$) to charge to a charge value corresponding to the pre-charge voltage $V_{PRE}$. The switches F2 and F3 then open, disconnecting the node 214 from ground and disconnecting the node 212 from the voltage $V_{PRE}$ in each of the first and second phases φ1, φ2. In each first phase φ1, the switch F1 then closes (conductive) pulling the voltage $V_{214}$ of the node 214 up to the voltage $V_{DD}$, modifying the voltage $V_{212}$ of the node 212. The mutual capacitance $C_M$ and the parasitic capacitor $C_{P2}$ form a voltage divider, and their charge values share out to establish the voltage $V_{212}$ of the node 212 at a voltage ($V_{PRE}+\Delta V+V_{NOISE}$), where $V_{NOISE}$ is interference, which may be due to conduction from a power supply or adjacent circuit elements, as illustrated symbolically by a source $V_{NOISE}$ and a capacitance $C_J$. The sampler 206 then samples the voltage $V_{212}$ of the node 212 during each first phase φ1, as shown at F1s in FIGS. 4 and 6. After the voltage sampling, the switch F1 remains closed (conductive) pulling the voltage $V_{214}$ of the node 214 up to the voltage $V_{DD}$.

At the start of each second phase φ2, the switch F3 closes (conducts) so that the pre-charger 202 applies the pre-charge voltage $V_{PRE}$ to the node 212 while the switch F1 remains closed, pulling the node 214 up to the voltage $V_{DD}$, while switch F2 is open (non-conductive). The switches F1 and F3 then open (non-conductive), leaving the nodes 214 and 212 floating. The switch F2 then closes, pulling the node 214 down to ground, modifying the voltage $V_{212}$ of the node 212. The charge values of the mutual capacitance $C_M$ and the parasitic capacitor $C_{P2}$ share out to establish the voltage $V_{212}$ of the node 212 at a voltage ($V_{PRE}-\Delta V+V_{NOISE}$). The sampler 206 then samples the voltage $V_{212}$ of the node 212 during each second phase φ2, as shown at F2s in FIG. 4.

The magnitude of the modification $\pm\Delta v$ of the voltage $V_{212}$ of the node 212 during each of the first and second phases φ1, φ2 is given by:

$$\Delta V = V_{DD} * C_M / (C_M + C_{P2}).$$

For components of the interference $V_{NOISE}$ at frequencies substantially below the repetition rate of the first and second phases φ1, φ2 of sensing the capacitance $C_M$, the magnitude of the interference $V_{NOISE}$ changes little, or not at all, between the first phase φ1 and the second phase φ2. In the sensors 200, 300 and 500, the use by the accumulator 208, 210 incrementally of the first sample signal I3 is additive, and its use decrementally of the second sample signal I5 is subtractive in providing the accumulator signal $V_{INT}$. The net effect of a single sense cycle of the two phases φ1, φ2 on the accumulator signal $V_{INT}$ is a progressive function of the sensed capacitance $C_M$, since the sensed capacitance $C_M$ is charged to different first and second charge values, by different first and second voltages, in the first and second phases φ1, φ2. However, the net effect of a single sense cycle tends to cancel components of the interference $V_{NOISE}$ that are at frequencies substantially below the repetition rate of the sensor cycle or that are direct current (DC).

Repetition of the sense cycles tends to average out components of the interference $V_{NOISE}$ at frequencies substantially higher than the repetition rate of the sense cycles except for components at frequencies equal to or multiples of the repetition rate of the cycles. The effect of such high frequency components can be reduced using a SSC technique to vary the repetition rate of the sense cycles.

In the sensor 300, illustrated in FIG. 3, the power supply voltage $V_{DD}$ is positive. The sampler 206 comprises a voltage-to-current converter that has a n-type MOSFET M1 whose gate is connected to the node 212. The source of the MOSFET M1 is connected to ground through a resistor R1 and its drain is connected to the drain of a p-type MOSFET M2. The drain of the MOSFET M2 is also connected to its gate and its source is connected to the power supply $V_{DD}$. The MOSFET M2 pulls up the drain of the MOSFET M1, and the source-drain paths of the MOSFETs M1 and M2 in series conduct a current I1 equal to $(V_{212}-V_{GS\_M1})/R1$, where R1 is the resistance of the resistor R1 and $V_{GS\_M1}$ is the gate-source voltage of the MOSFET M1.

The gate of the MOSFET M2 is connected to the gate of a p-type MOSFET M3, whose source is connected to the power supply $V_{DD}$, forming a current mirror. The drain of the MOSFET M3 is connected through a switch F1s to a node 302, connected to one plate of the accumulator capacitor $C_{INT}$, the other plate of which is connected to ground. A controller (not shown) controls the switch F1s (and the other switches) so that the switch F1s is closed to conduct the source-drain current I3 of the MOSFET M3 during a sample period of each first phase φ1 as the first sample signal to charge incrementally the accumulator capacitor $C_{INT}$, and is otherwise open.

The drain of the MOSFET M3 is also connected through a switch F1sb, which opens when the switch F1s closes and closes when the switch F1s opens, to the drain of an n-type MOSFET M4, forming a current mirror with an n-type MOSFET M5. The gates of the MOSFETs M4 and M5 are connected together and the drain of the MOSFET M4 is also connected to its gate. The sources of the MOSFETs M4 and M5 are connected to ground. The drain of the MOSFET M5 is connected to the node 302 through a switch F2s. During a sample period of each second phase φ2, the switch F2s is closed to conduct the source-drain current I5 of the MOSFET M5 as the second sample signal to discharge decrementally the accumulator capacitor $C_{INT}$, and is otherwise open. When the switch F1sb is closed, the current I4 flowing through the MOSFET M4 is equal to the current I3 of the MOSFET M3. The current I5 of the MOSFET M5 discharges the accumulator capacitor $C_{INT}$ as the second sample signal when the switch F2s is closed during a sample period of each second phase φ2. The MOSFETs M4 and M5 are the same size in this example, so that the current I5 is equal to the current I3 of the MOSFET M3, and therefore the same magnitude as the first sample signal that charges incrementally the accumulator capacitor $C_{INT}$, during the first phase φ1.

The accumulator signal $V_{INT}$ varies in steps $\delta V_{INT}$ in each of the sensor cycles as a function of the net charge and discharge current $I_{NET}$ in a cycle, as given by the following equations:

$$\delta V_{INT} = I_{NET} * T_S / C_{INT} = (I3 - I5) * T_S / C_{INT}$$

$$= \left[ \frac{(V_{PRE} + \Delta V + V_{NOISE} - V_{GS_{M1}})}{R1} * n - \right.$$

$$\left. \frac{(V_{PRE} - \Delta V + V_{NOISE} - V_{GS_{M1}})}{R1} * n \right] * T_S / C_{INT}$$

$$= \left[ \frac{2 * \Delta V}{R1} * n \right] * T_S / C_{INT}$$

$$= \frac{2 * n * C_M * V_{DD} * T_S}{R1 * C_{INT} * (C_M + C_{P2})}$$

where $\delta V_{INT}$ is the change in the accumulator signal $V_{INT}$ in one sensor cycle, $T_S$ is sampling period, which is the same length in the first and second phases φ1 and φ2, and n is the ratio I3/I2 of the currents in (and the sizes of) the MOSFETs M3 and M2.

The number N of sensor cycles taken to change the accumulator signal $V_{INT}$ by $V_{REF}$ is:

$$N = \frac{V_{REF}}{\delta V_{INT}} = \frac{R1 * C_{INT} * (C_M + C_{P2}) * V_{REF}}{2 * n * C_M * V_{DD} * T_S}.$$

Typically, the parasitic capacitance $C_P$ is much greater than the mutual capacitance $C_F$: $C_P \gg C_M$, so $$N \approx \frac{R1 * C_{INT} * C_{P2} * V_{REF}}{2 * n * C_M * V_{DD} * T_S}.$$

The output signal $N_{OUT}$ given by the counter 220 is equal to the number N of sensor cycles and is reset to zero after being read out. The output signal $N_{OUT}$ is inversely proportional to $C_M$, so that when a touching event occurs, $C_M$ decreases, and the output signal $N_{OUT}$ will increase proportionally, with a high degree of independence from noise.

Figure 6:
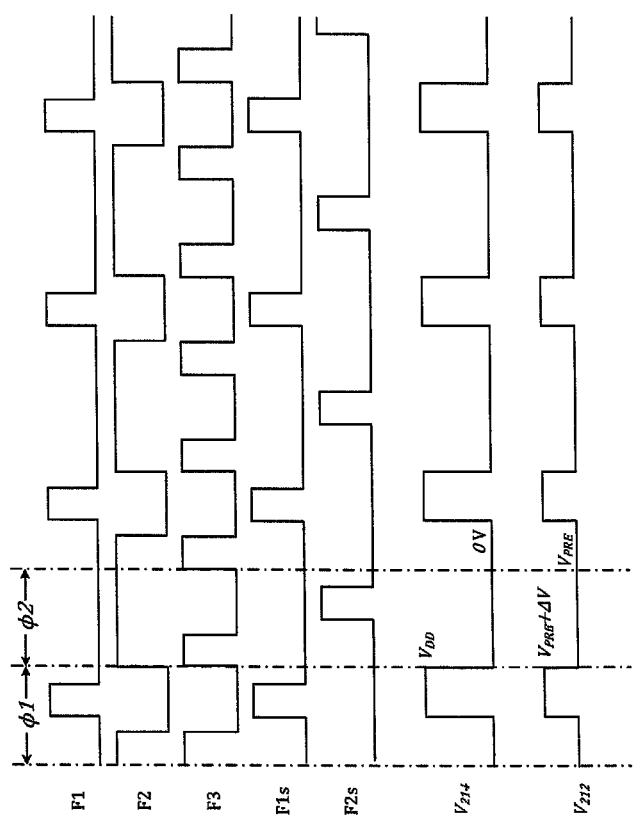
FIG. 6 is a graph against time of signals appearing in operation of yet another example of capacitive sensing apparatus in accordance with an embodiment of the invention.

FIG. 6 illustrates the operation of a variant (not shown) of the sensors 300 and 500, in which the controller controls the charger 202, 204 to apply the modifying voltage $V_1$ to the second connection 214 to charge the sensed capacitance $C_M$ during one of the first and second phases φ1, φ2 to a greater (or lesser) charge value than the pre-charge voltage $V_{PRE}$ does, and leaves the sensed capacitance $C_M$ during the other of the first and second phases φ2, φ1 at the same charge value as the pre-charge voltage $V_{PRE}$ does. The number N of sensor cycles taken to change the accumulator signal $V_{INT}$ by $V_{REF}$ is:

$$N \approx \frac{R1 * C_{INT} * C_{P2} * V_{REF}}{n * C_M * V_{DD} * T_S}.$$

The output signal $N_{OUT}$ given by the counter 220 is still inversely proportional to $C_M$, but with a smaller constant of proportionality than in the operation illustrated in FIG. 4, so that a touching event is still sensed.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate of the IC described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A sensor for providing an output signal that is a function of a sensed capacitance to which the sensor is connected, the sensor comprising:
   a charger for repetitively applying first and second voltages to charge the sensed capacitance to first and second charge values in first and second phases respectively;
   a sampler for providing first and second sample signals that are a function of the first and second charge values respectively; and
   an accumulator for using an accumulator signal to provide the output signal;

wherein the accumulator repetitively uses the first sample signal incrementally and the second sample signal decrementally in providing the accumulator signal, and wherein the accumulator signal is a progressive function of the sensed capacitance but tends to cancel a noise in the first and second sample signals at frequencies less than a repetition rate of operation of the accumulator.

2. The sensor of claim 1, wherein the accumulator includes an accumulator capacitor whose charge value is a progressive function of the sample signals, and wherein the accumulator signal is a function of the charge value on the accumulator capacitor.

3. The sensor of claim 1, wherein the sample signals are current signals.

4. The apparatus of claim 3, wherein the sampler includes a voltage-to-current converter for converting voltages at the sensed capacitance to current signals.

5. The sensor of claim 3, wherein the accumulator includes at least a first current mirror for controlling the rate at which the accumulator signal varies.

6. The sensor of claim 5, wherein the first current mirror controls the rate at which the accumulator signal varies incrementally as a function of the first sample signal, and controls supply of current to a second current mirror which controls the rate at which the accumulator signal varies decrementallys as a function of the second sample signal.

7. The sensor of claim 1 for use with an array of capacitance elements where the sensed capacitance is a mutual capacitance between capacitance elements of the array in the presence of parasitic capacitances to other elements, wherein the sensor includes switch arrays for connecting the charger through a first connection to apply a pre-charge voltage to a selected capacitance element and for connecting the charger through a second connection to apply a modifying voltage to the selected capacitance element during at least one of the first and second phases.

8. The sensor of claim 7, wherein the sampler is connected to the first connection to provide the first and second sample signals while the charger is disconnected from the first connection.

9. The sensor of claim 7, wherein the charger applying the modifying voltage to the second connection charges the sensed capacitance during one of the first and second phases to a greater charge value than the pre-charge voltage does, and charges the sensed capacitance during the other of the first and second phases to a lesser charge value than the pre-charge voltage does.

10. The sensor of claim 7, wherein the charger applying the modifying voltage to the second connection charges the sensed capacitance during one of the first and second phases to a greater charge value than the pre-charge voltage does, and leaves the sensed capacitance during the other of the first and second phases at the same charge value as the pre-charge voltage does.

11. A capacitive sensing apparatus comprising a sensor and a sensed capacitance to which the sensor is connected, the sensor comprising:
a charger for repetitively applying first and second voltages to charge the sensed capacitance to first and second charge values in first and second phases respectively;
a sampler for providing first and second sample signals that are a function of the first and second charge values respectively; and
an accumulator for using an accumulator signal to provide an output signal that is a function of the sensed capacitance;
wherein the accumulator repetitively uses the first sample signal incrementally and the second sample signal decrementally in providing the accumulator signal, and wherein the accumulator signal is a progressive function of the sensed capacitance but tends to cancel a noise in the first and second sample signals at frequencies less than a repetition rate of operation of the accumulator.

12. The apparatus of claim 11, wherein the accumulator includes an accumulator capacitor whose charge value is a progressive function of the sample signals, and wherein the accumulator signal is a function of the charge value on the accumulator capacitor.

13. The apparatus of claim 11, wherein the sample signals are current signals.

14. The apparatus of claim 13, wherein the sampler includes a voltage-to-current converter for converting voltages at the sensed capacitance to current signals.

15. The apparatus of claim 13, wherein the accumulator includes at least a first current mirror for controlling the rate at which the accumulator signal varies.

16. The apparatus of claim 15, wherein the first current mirror controls the rate at which the accumulator signal varies incrementally as a function of the first sample signal, and controls supply of current to a second current mirror which controls the rate at which the accumulator signal varies decrementally as a function of the second sample signal.

17. The apparatus of claim 11, wherein:
the apparatus includes a panel comprising an array of capacitance elements,
the sensed capacitance is a mutual capacitance between capacitance elements of the array in the presence of parasitic capacitances to other elements, the mutual capacitance being a function of proximity of an object to the selected capacitance element, and
the sensor includes switch arrays for connecting the charger through a first connection to apply a pre-charge voltage to a selected capacitance element and for connecting the charger through a second connection to apply a modifying voltage to the selected capacitance element during at least one of the first and second phases.

18. The apparatus of claim 17, wherein the sampler is connected to the first connection to provide the first and second sample signals while the charger is disconnected from the first connection.

19. The apparatus of claim 17, wherein the charger applying the modifying voltage to the second connection charges the sensed capacitance during one of the first and second phases to a greater charge value than the pre-charge voltage does, and charges the sensed capacitance during the other of the first and second phases to a lesser charge value than the pre-charge voltage does.

20. The apparatus of claim 17, wherein the charger applying the modifying voltage to the second connection charges the sensed capacitance during one of the first and second phases to a greater charge value than the pre-charge voltage does, and leaves the sensed capacitance during the other of the first and second phases at the same charge value as the pre-charge voltage does.

* * * * *